US010344761B2

(12) United States Patent
Ignatiev et al.

(10) Patent No.: US 10,344,761 B2
(45) Date of Patent: Jul. 9, 2019

(54) ROTARY COMPRESSOR WITH VAPOR INJECTION SYSTEM

(71) Applicant: Emerson Climate Technologies, Inc., Sidney, OH (US)

(72) Inventors: Kirill M. Ignatiev, Sidney, OH (US); Michael M. Perevozchikov, Tipp City, OH (US)

(73) Assignee: Emerson Climate Technologies, Inc., Sidney, OH (US)

( * ) Notice: Subject to any disclaimer, the term of this patent is extended or adjusted under 35 U.S.C. 154(b) by 0 days.

(21) Appl. No.: 15/935,608

(22) Filed: Mar. 26, 2018

(65) Prior Publication Data

US 2018/0209423 A1 Jul. 26, 2018

Related U.S. Application Data

(63) Continuation of application No. 15/130,326, filed on Apr. 15, 2016, now abandoned, which is a (Continued)

(51) Int. Cl.

*F04C 28/28* (2006.01)
*F04C 29/00* (2006.01)

(Continued)

(52) U.S. Cl.

CPC ................ *F04C 28/28* (2013.01); *F01C 1/46* (2013.01); *F04B 39/121* (2013.01); *F04B 49/10* (2013.01);

(Continued)

(58) Field of Classification Search

CPC ....................................................... F04C 28/28

(Continued)

(56) References Cited

U.S. PATENT DOCUMENTS 4,331,002 A 5/1982 Ladusaw
4,636,152 A * 1/1987 Kawaguchi ......... F04C 18/3564 418/54

(Continued)

FOREIGN PATENT DOCUMENTS

CN 2748672 Y 12/2005
CN 201092959 Y 7/2008

(Continued)

OTHER PUBLICATIONS

International Search Report regarding Application No. PCT/US2014/059918, dated Jan. 21, 2015.

(Continued)

*Primary Examiner* — Stanley Tso
(74) *Attorney, Agent, or Firm* — Harness, Dickey & Pierce, P.L.C.

(57) ABSTRACT

A compressor may include a crankshaft, first and second cylinder housings, first and second rotors, a divider plate, and first and second valves. The crankshaft includes first and second eccentric portions. The cylinder housings define cylindrical recesses. The rotors are disposed within respective cylindrical recesses and engage respective eccentric portions of the crankshaft. The first rotor and the first cylindrical recess define a first compression chamber therebetween. The second rotor and the second cylindrical recess define a second compression chamber therebetween. The divider plate may be disposed between the cylinder housings and may include first and second fluid openings in communication with the first and second compression chambers. The valves may be moveable relative to the divider plate between a first position allowing fluid flow through the fluid openings and a second position restricting fluid flow through the fluid openings.

20 Claims, 3 Drawing Sheets

Related U.S. Application Data continuation of application No. 14/509,103, filed on Oct. 8, 2014, now Pat. No. 9,322,405.

(60) Provisional application No. 61/896,881, filed on Oct. 29, 2013.

(51) Int. Cl.

| | |
|---|---|
| ***F04C 18/356*** | (2006.01) |
| ***F04C 2/46*** | (2006.01) |
| ***F04C 28/12*** | (2006.01) |
| ***F01C 1/46*** | (2006.01) |
| ***F04C 23/00*** | (2006.01) |
| ***F04B 39/12*** | (2006.01) |
| ***F04B 49/10*** | (2006.01) |
| ***H01R 24/20*** | (2011.01) |
| ***H01R 24/28*** | (2011.01) |
| ***H05K 5/00*** | (2006.01) |

(52) U.S. Cl.
CPC ............ *F04C 2/46* (2013.01); *F04C 18/3562* (2013.01); *F04C 18/3564* (2013.01); *F04C 23/001* (2013.01); *F04C 28/12* (2013.01); *F04C 28/125* (2013.01); *F04C 29/0007* (2013.01); *F04C 29/0014* (2013.01); *H01R 24/20* (2013.01); *H01R 24/28* (2013.01); *H05K 5/0017* (2013.01); *F04C 23/008* (2013.01)

(58) Field of Classification Search
USPC .......................................................... 174/520
See application file for complete search history.

(56) References Cited

U.S. PATENT DOCUMENTS

| | | | |
|---|---|---|---|
| 5,511,389 A | 4/1996 | Bush et al. | |
| 5,564,917 A | 10/1996 | Leyderman et al. | |
| RE40,830 E | 7/2009 | Caillat | |
| 8,430,656 B2 | 4/2013 | Byun et al. | |
| 9,322,405 B2 | 4/2016 | Ignatiev et al. | |
| 2007/0071628 A1 | 3/2007 | Newland | |
| 2008/0264921 A1 | 10/2008 | Kropp et al. | |
| 2011/0076162 A1 | 3/2011 | Heidecker et al. | |
| 2011/0150683 A1* | 6/2011 | Lee ....................... | F04C 18/086 418/5 |
| 2012/0308425 A1* | 12/2012 | Morishita ........... | F04C 18/3564 418/259 |
| 2013/0209299 A1 | 8/2013 | Santos et al. | |

FOREIGN PATENT DOCUMENTS

| | | |
|---|---|---|
| CN | 101294568 A | 10/2008 |
| CN | 201162675 Y | 12/2008 |
| CN | 101586562 A | 11/2009 |
| CN | 202280621 U | 6/2012 |
| CN | 102808768 A | 12/2012 |
| JP | S5865994 A | 4/1983 |
| JP | H07127575 A | 5/1995 |
| JP | 2004324652 A | 11/2004 |
| JP | 2012251485 A | 12/2012 |
| WO | WO-2010028526 A1 | 3/2010 |

OTHER PUBLICATIONS

Written Opinion of the International Searching Authority regarding Application No. PCT/US2014/059918, dated Jan. 21, 2015.
Office Action regarding U.S. Appl. No. 14/509,103, dated Nov. 16, 2015.
Office Action regarding Chinese Patent Application No. 201480059873.8, dated Dec. 19, 2016. Translation provided by Unitalen Attorneys at Law.
Office Action regarding U.S. Appl. No. 15/130,326, dated Aug. 16, 2017.
Office Action regarding Chinese Patent Application No. 201480059873.8, dated Sep. 11, 2017. Translation provided by Unitalen Attorneys at Law.
Office Action regarding Korean Patent Application No. 10-2016-7011920, dated Nov. 21, 2017. Translation provided by Y.S. Chang & Associates.
Office Action regarding U.S. Appl. No. 15/130,326, dated Jan. 8, 2018.

* cited by examiner

ROTARY COMPRESSOR WITH VAPOR INJECTION SYSTEM

CROSS-REFERENCE TO RELATED APPLICATIONS

This application is a continuation of U.S. patent application Ser. No. 15/130,326, filed on Apr. 15, 2016, which is a continuation of U.S. patent application Ser. No. 14/509,103 filed on Oct. 8, 2014 (now U.S. Pat. No. 9,322,405), which claims the benefit of U.S. Provisional Application No. 61/896,881, filed on Oct. 29, 2013. The entire disclosures of the above applications are incorporated herein by reference.

FIELD

The present disclosure relates to a rotary compressor with a fluid-injection system.

BACKGROUND

This section provides background information related to the present disclosure and is not necessarily prior art.

A climate-control system such as a heat-pump system, a refrigeration system, or an air conditioning system, for example, may include a fluid circuit having an outdoor heat exchanger, an indoor heat exchanger, an expansion device disposed between the indoor and outdoor heat exchangers, and one or more compressors circulating a working fluid (e.g., refrigerant or carbon dioxide) between the indoor and outdoor heat exchangers. Efficient and reliable operation of the compressor is desirable to ensure that the climate-control system in which the compressor is installed is capable of effectively and efficiently providing a cooling and/or heating effect on demand.

SUMMARY

This section provides a general summary of the disclosure, and is not a comprehensive disclosure of its full scope or all of its features.

In one form, the present disclosure provides a compressor that may include a crankshaft, a cylinder housing, a rotor, a suction opening, a discharge opening, and a fluid-injection opening. The crankshaft may include an eccentric portion. The cylinder housing may define a cylindrical recess through which the crankshaft extends. The rotor may be disposed within the cylindrical recess and may engage the eccentric portion of the crankshaft for movement with the crankshaft relative to the cylindrical recess. The rotor and a circumferential surface of the cylindrical recess may define a compression chamber therebetween. The suction opening may provide fluid at a first pressure to the cylindrical recess. The discharge opening may receive compressed fluid from the compression chamber. The fluid-injection opening may provide fluid at a second pressure to the compression chamber. The second pressure may be higher than the first pressure. The fluid-injection opening and the discharge opening may be at least partially aligned with each other in a direction parallel to a rotational axis of the crankshaft such that the discharge opening and the fluid-injection opening are at least partially disposed along a plane extending through the rotational axis.

In some embodiments, the fluid-injection opening may be formed in the cylinder housing.

In some embodiments, the fluid-injection opening may be formed in a plate disposed axially adjacent the cylinder housing and partially defining the compression chamber.

In some embodiments, the fluid-injection opening may be at least partially axially aligned with the circumferential surface of the cylindrical recess.

In some embodiments, the compressor may include a valve movable relative to the cylindrical recess between a first position allowing fluid flow through the fluid-injection opening and a second position restricting fluid flow through the fluid-injection opening.

In some embodiments, the valve may be movable between the first and second positions in response to a change in a pressure differential between the compression chamber and a fluid-injection source.

In some embodiments, the compressor may include a vane member reciprocating relative to the cylinder housing and extending between the cylinder housing and the rotor. The vane member may be disposed angularly between the suction opening and the discharge opening and may partially define the compression chamber.

In some embodiments, the compressor may include a shell in which the cylinder housing, the rotor and the crankshaft are disposed.

In some embodiments, the compressor may include a motor assembly disposed within the shell and drivingly engaging the crankshaft.

In another form, the present disclosure provides a compressor that may include a crankshaft, first and second cylinder housings, first and second rotors, a divider plate, and first and second valves. The crankshaft may include first and second eccentric portions. The first and second cylinder housings may define first and second cylindrical recesses, respectively, through which the crankshaft extends. The first rotor may be disposed within the first cylindrical recess and may engage the first eccentric portion of the crankshaft for movement with the crankshaft relative to the first cylindrical recess. The first rotor and a first circumferential surface of the first cylindrical recess may define a first compression chamber therebetween. The second rotor may be disposed within the second cylindrical recess and may engage the second eccentric portion of the crankshaft for movement with the crankshaft relative to the second cylindrical recess. The second rotor and a second circumferential surface of the second cylindrical recess may define a second compression chamber therebetween. The divider plate may be disposed between the first and second cylinder housings and between the first and second rotors. The divider plate may include first and second fluid outlets in communication with the first and second compression chambers, respectively. The first and second valves may be moveable relative to the divider plate between a first position allowing fluid flow through the first and second fluid outlets and a second position restricting fluid flow through the first and second fluid outlets.

In some embodiments, the compressor may include a suction opening providing fluid at a first pressure to the first cylindrical recess, and a discharge opening receiving compressed fluid from the first compression chamber. The first and second fluid outlets may provide fluid at a second pressure to the first and second compression chambers, respectively. The second pressure may be higher than the first pressure.

In some embodiments, the first and second fluid outlets and the discharge opening may be at least partially aligned with each other in a direction parallel to a rotational axis of the crankshaft such that the discharge opening and the first and second fluid outlets are at least partially disposed along a plane extending through the rotational axis.

In some embodiments, the first and second fluid outlets may be at least partially axially aligned with the first and second circumferential surfaces.

In some embodiments, the compressor may include a vane member reciprocating relative to the first cylinder housing and extending between the first cylinder housing and the first rotor. The vane member may be disposed angularly between the suction opening and the discharge opening and may partially define the first compression chamber.

In some embodiments, the first and second fluid outlets may be at least partially disposed angularly between the vane and the discharge opening.

In some embodiments, the divider plate may include a fluid passageway extending radially therethrough and communicating with the first and second fluid outlets.

In some embodiments, the first and second cylinder housings may include first and second fluid passageways, respectively, extending radially therethrough and communicating with the first and second fluid outlets, respectively.

In some embodiments, the first and second valve members may be movably received in the first and second fluid passageways, respectively.

In some embodiments, the compressor may include a shell and a motor assembly. The first and second cylinder housings, the first and second rotors, and the crankshaft may be disposed within the shell. The motor assembly may drivingly engage the crankshaft.

In some embodiments, the first valve may be movable between the first and second positions in response to a change in a pressure differential between the first compression chamber and a fluid-injection source. The second valve may be movable between the first and second positions in response to a change in a pressure differential between the second compression chamber and the fluid-injection source.

Further areas of applicability will become apparent from the description provided herein. The description and specific examples in this summary are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

Corresponding reference numerals indicate corresponding parts throughout the several views of the drawings.

DETAILED DESCRIPTION

Figure 1:
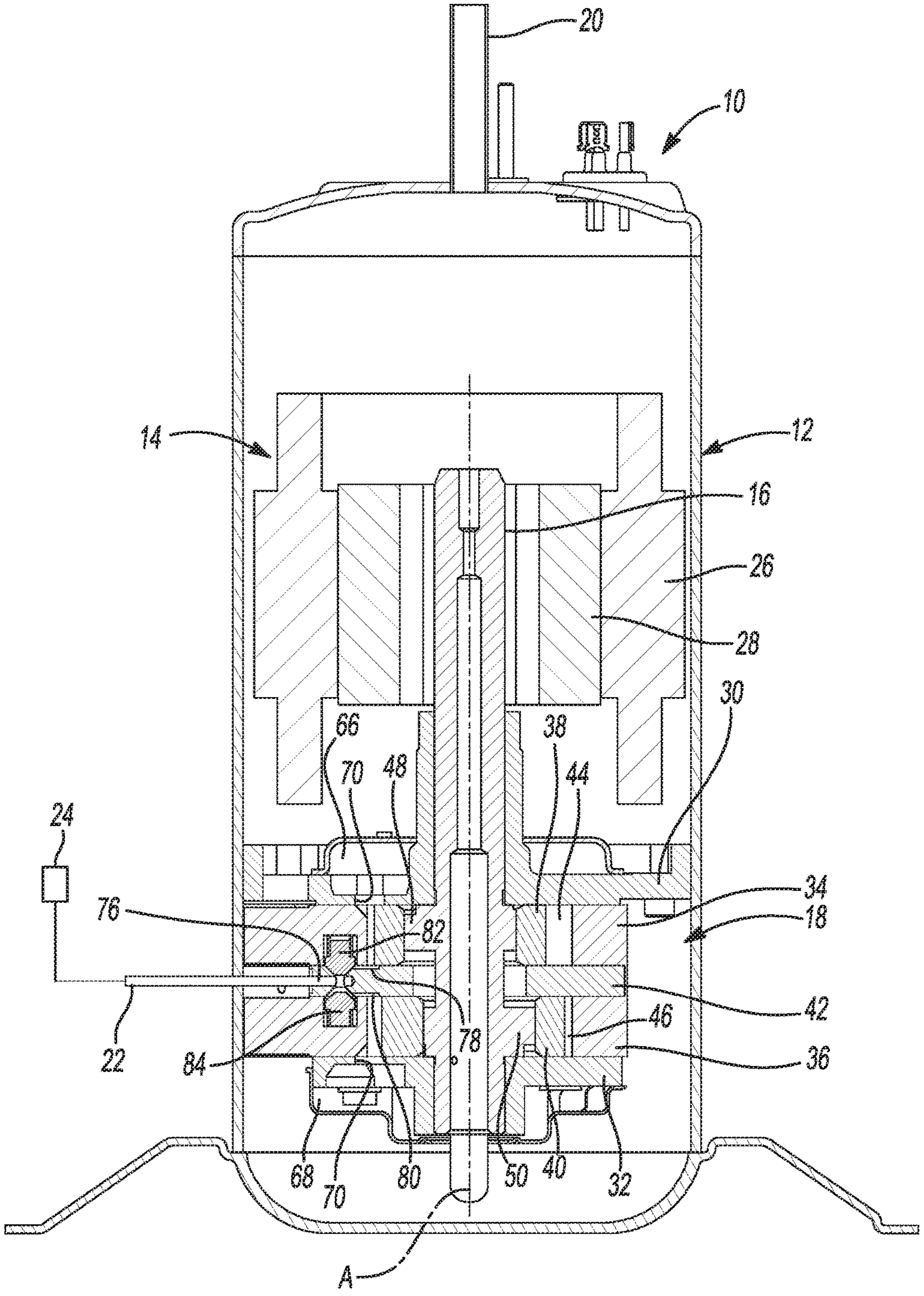
FIG. 1 is a cross-sectional view of a compressor according to the principles of the present disclosure.

Example embodiments will now be described more fully with reference to the accompanying drawings.

Example embodiments are provided so that this disclosure will be thorough, and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms and that neither should be construed to limit the scope of the disclosure. In some example embodiments, well-known processes, well-known device structures, and well-known technologies are not described in detail.

The terminology used herein is for the purpose of describing particular example embodiments only and is not intended to be limiting. As used herein, the singular forms "a," "an," and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

When an element or layer is referred to as being "on," "engaged to," "connected to," or "coupled to" another element or layer, it may be directly on, engaged, connected or coupled to the other element or layer, or intervening elements or layers may be present. In contrast, when an element is referred to as being "directly on," "directly engaged to," "directly connected to," or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Terms such as "first," "second," and other numerical terms when used herein do not imply a sequence or order unless clearly indicated by the context. Thus, a first element, component, region, layer or section discussed below could be termed a second element, component, region, layer or section without departing from the teachings of the example embodiments.

Spatially relative terms, such as "inner," "outer," "beneath," "below," "lower," "above," "upper," and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

Figure 2:
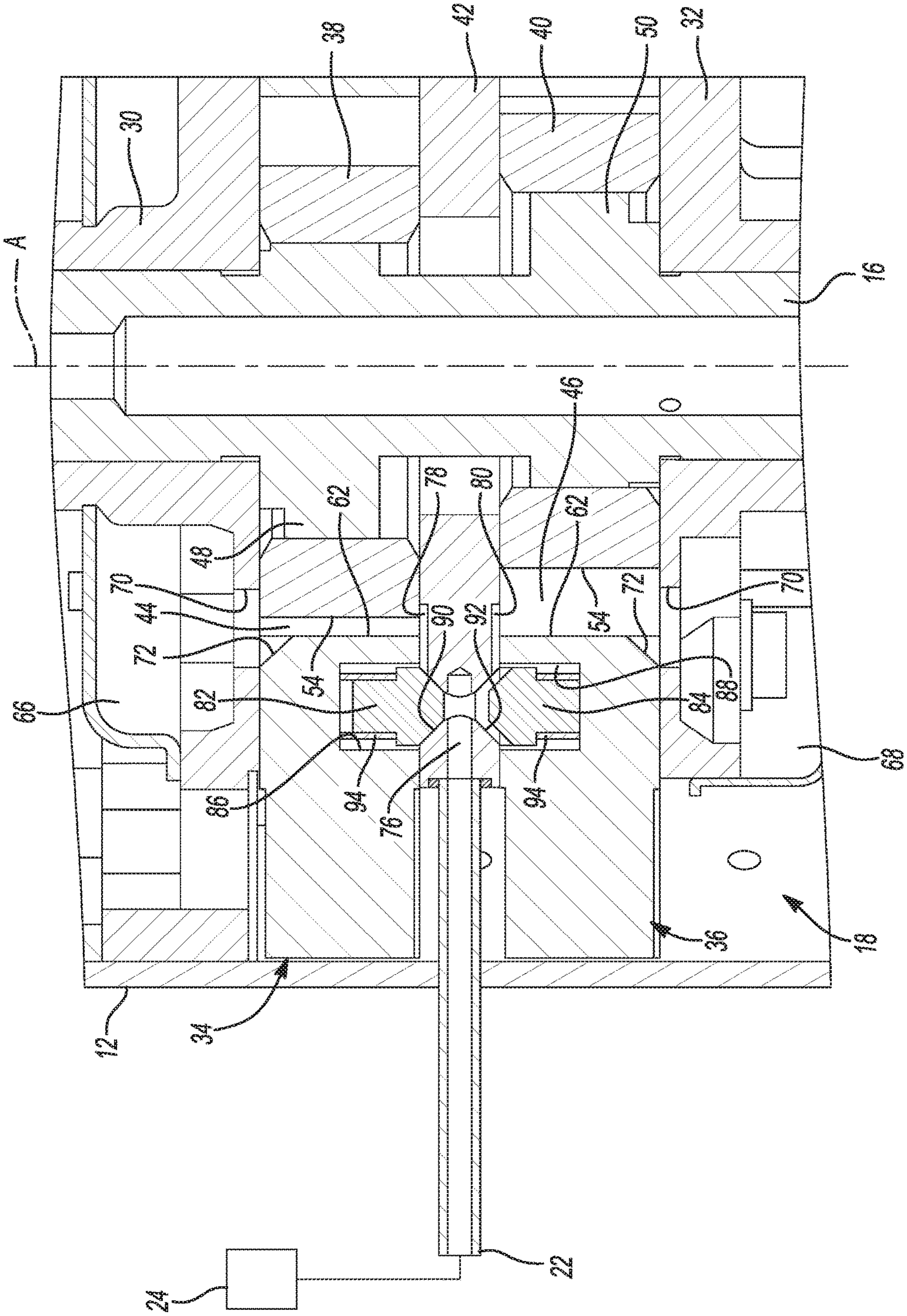
FIG. 2 is a partial cross-sectional view of the compressor of FIG. 1.
Figure 3:
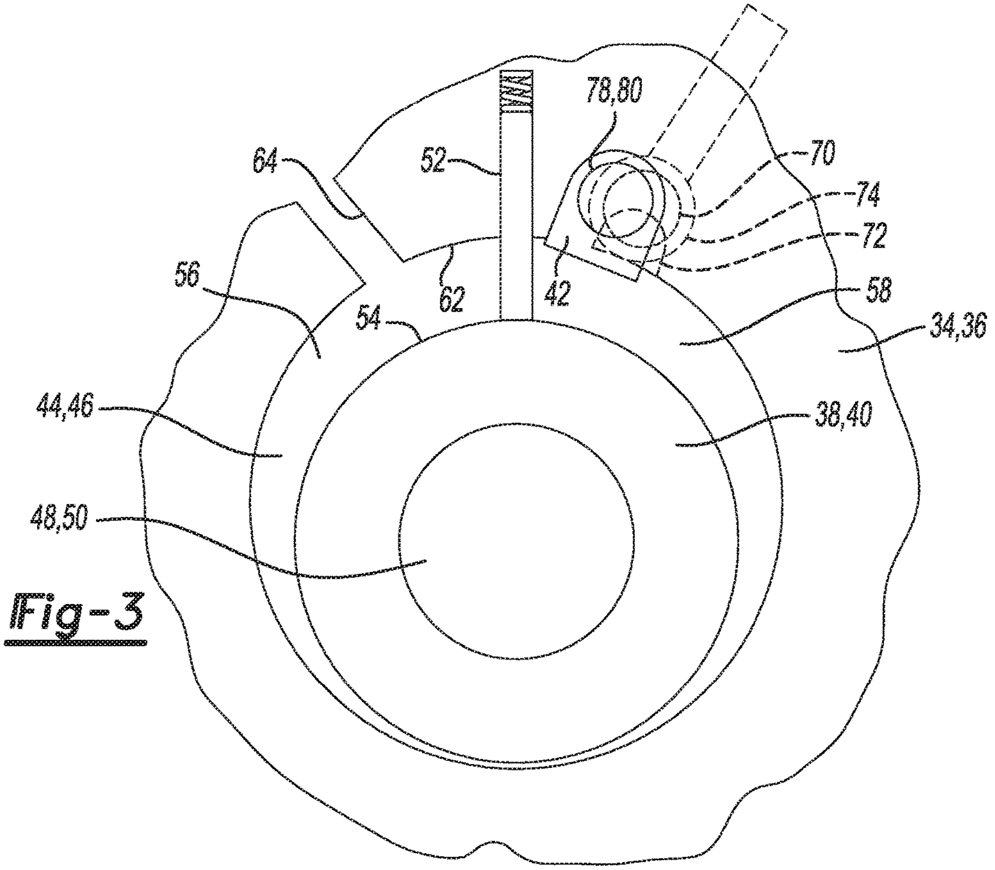
FIG. 3 is a schematic representation of a compression mechanism of the compressor.

With reference to FIGS. 1-3, a compressor 10 is provided that may include an outer shell 12, a motor assembly 14, a crankshaft 16, and a compression mechanism 18. The outer shell 12 may house the motor assembly 14, the crankshaft 16 and the compression mechanism 18 and may include one or more suction fittings (not shown), a discharge fitting 20 and a fluid-injection fitting 22. The suction fittings may receive suction-pressure working fluid from a low-side component (e.g., an evaporator) of a climate-control system in which the compressor 10 may be incorporated. The suction fittings may provide the suction-pressure working fluid to the compression mechanism 18. The discharge fitting 20 may receive compressed working fluid (e.g., at a discharge pressure) from the compression mechanism and provide the compressed working fluid to a high-side component (e.g., a condenser or a gas cooler) of the climate-control system. As will be described in more detail below, the fluid-injection fitting 22 may receive working fluid from a fluid-injection source 24 at an intermediate pressure (i.e., a pressure higher than suction pressure and lower than discharge pressure) and provide the intermediate pressure working fluid to the compression mechanism 18. The fluid-injection source 24 may include an economizer, a flash tank or a plate-heat-exchanger, for example. The intermediate-pressure working fluid could be a vapor, a liquid or a mixture of vapor and liquid.

The motor assembly 14 may include a stator 26 and a rotor 28. The stator 26 may be fixed relative to the outer shell 12 and may surround the rotor 28. The rotor 28 may drivingly engage the crankshaft 16 for rotation relative to the stator 26 about a rotational axis A of the crankshaft 16. Upper and lower flanges 30, 32 may be fixed relative to the shell 12 and may house bearings (not shown) that rotatably support the crankshaft 16.

The compression mechanism 18 may include first and second cylinder housings 34, 36, first and second rotors 38, 40, and a divider plate 42. The first and second cylinder housings 34, 36 may be fixed relative to the shell 12 and may include first and second cylindrical recesses 44, 46, respectively. The first cylinder housing 34 may be disposed between the upper flange 30 and the divider plate 42. The second cylinder housing 36 may be disposed between the divider plate 42 and the lower flange 32. The first and second rotors 38, 40 may be disposed within the first and second cylindrical recesses 44, 46, respectively, and may engage first and second eccentric portions 48, 50, respectively, of the crankshaft 16. Accordingly, rotation of the crankshaft 16 about the rotational axis A causes the first and second rotors 38, 40 to rotate in an orbital path within the first and second cylindrical recesses 44, 46.

Each of the first and second cylinder housings 34, 36 may reciprocatingly receive a vane 52 (FIG. 3). The vanes 52 may extend radially into the first and second cylindrical recesses 44, 46 and may be spring-biased into contact with a radially outer circumferential surface 54 of the rotors 38, 40. The vanes 52 may reciprocate relative to the cylinder housings 34, 36 as the rotors 38, 40 rotate within the cylindrical recesses 44, 46. As shown in FIG. 3, the vanes 52 may separate a suction chamber 56 from a compression chamber 58 within each of the first and second cylindrical recesses 44, 46 between the circumferential surface 54 of each rotor 38, 40 and a diametrical circumferential surface 62 of each cylindrical recess 44, 46. Each suction chamber 56 may be defined between one side of the vane 52 and a point of sealing contact between the circumferential surfaces 54, 62 (or a point at which the clearance between the circumferential surfaces 54, 62 is at its smallest). Each compression chamber 58 may be defined between the other side of the vane 52 and the point of sealing contact (or the point at which the clearance between the circumferential surfaces 54, 62 is at its smallest) between the circumferential surfaces 54, 62.

Suction openings 64 may be formed in the divider plate 42 and/or the cylinder housings 34, 36. Each suction opening 64 may provide suction-pressure working fluid from a corresponding suction fitting to a corresponding suction chamber 56. Working fluid may be compressed in the compression chambers 58 and discharged into corresponding discharge mufflers 66, 68 through discharge openings 70. Each of the discharge openings 70 may be formed in a corresponding one of the upper and lower flanges 30, 32. Each cylinder housing 34, 36 may include a discharge recess 72 in communication with a corresponding one of the discharge openings 70. The discharge recesses 72 may increase flow areas into the discharge openings 70. Discharge valves 74 (shown schematically in FIG. 3) may restrict or prevent working fluid in the discharge mufflers 66, 68 from flowing back into the compression chambers 58. From the discharge mufflers 66, 68, working fluid may exit the compressor 10 through the discharge fitting 20.

The divider plate 42 may include a fluid-injection passageway 76 in communication with first and second fluid-injection openings 78, 80 formed therein. The fluid-injection passageway 76 may be fluidly coupled with the fluid-injection fitting 22. The fluid-injection openings 78, 80 may be at least partially aligned with the discharge openings 70 in radial, angular and/or axial directions. For example, a plane may be defined (e.g., the plane defining the cross section of FIG. 2) that extends through the rotational axis A and the fluid-injection openings 78, 80 and the discharge openings 70. In some embodiments, the fluid-injection openings 78, 80 may be at least partially disposed angularly between the discharge openings 70 and the vanes 52, as shown in FIG. 3. As shown in FIG. 2, the fluid-injection openings 78, 80 may extend radially inward and radially outward relative to the circumferential surfaces 62 of the cylindrical recesses 44, 46. In some embodiments, the fluid-injection openings 78, 80 may be substantially concentric with the discharge openings 70.

A first valve member 82 may be disposed between the fluid-injection passageway 76 and the first fluid-injection opening 78. A second valve member 84 may be disposed between the fluid-injection passageway 76 and the second fluid-injection opening 80. The first and second valve members 82, 84 may be movably received within respective first and second recesses 86, 88 formed in the first and second cylinder housings 34, 36, respectively. Each of the first and second valve members 82, 84 may independently move between a first position in which the valve member 82, 84 engages a corresponding one of first and second valve seats 90, 92 formed on the divider plate 42 and a second position in which the valve member 82, 84 is spaced apart from the corresponding one of the first and second valve seats 90, 92. Springs 94 may bias the first and second valve members 82, 84 toward the first position.

In the first position, the valve members 82, 84 may restrict or prevent fluid flow between the fluid-injection passageway 76 and corresponding fluid-injection openings 78, 80. In the second position, the valve members 82, 84 may allow fluid flow between the fluid-injection passageway 76 and the corresponding fluid-injection openings 78, 80. FIG. 2 depicts the first valve member 82 in the first position and the second valve member 84 in the second position. The valve members 82, 84 shown in the figures are moved between the first and second positions in response to changes in pressure differentials between the fluid-injection passageway 76 and corresponding compression chambers 58. Therefore, the valve members 82, 84 may remain in the second position as long as the pressure of the working fluid at the fluid-injection source 24 is greater a predetermined value higher than the pressure of the working fluid in the corresponding compression chamber 58. The predetermined value may be established by selection of a spring rate of the springs 94. In some embodiments, the valve members 82, 84 could be solenoid-actuated valves, for example, or any other suitable type of valve.

Figure 4:
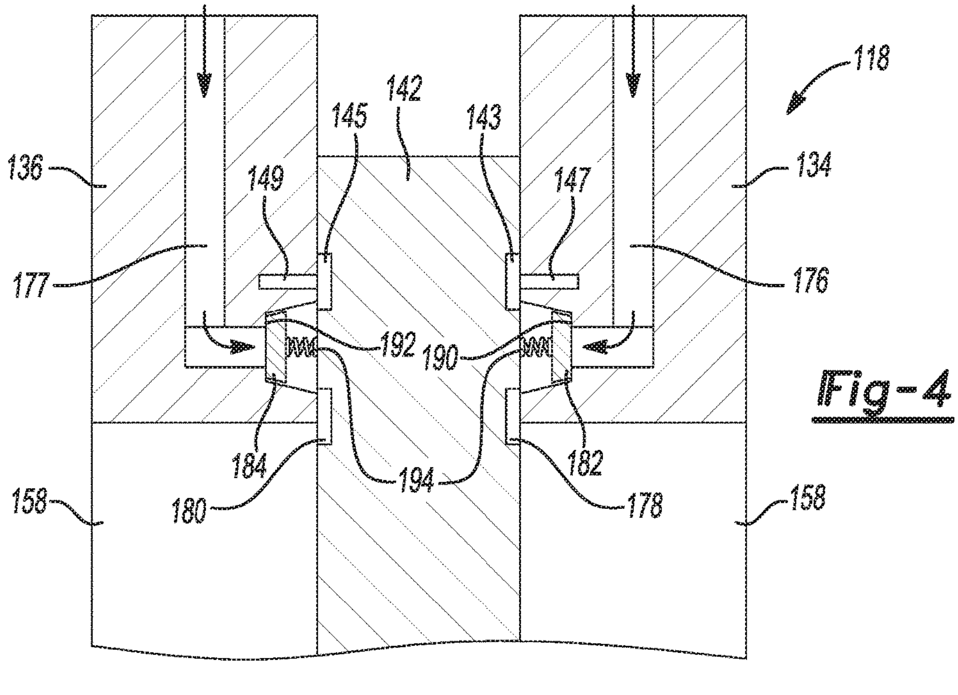
FIG. 4 is a schematic, partial cross-sectional view of another compression mechanism according to the principles of the present disclosure.

With reference to FIG. 4, an alternative compression mechanism 118 having cylinder housings 134, 136, a divider plate 142 and first and second rotors (not shown) are provided. The structures and functions of the cylinder housings 134, 136 and divider plate 142 may be similar or identical to that of the cylinder housings 34, 36 and divider plate 42 described above, apart from any differences described below and/or shown in the figures. Therefore, similar features may not be described again in detail.

The cylinder housings 134, 136 may include first and second fluid-injection passageways 176, 177, respectively. The fluid-injection passageways 176, 177 may be fluidly coupled to the fluid-injection source 24 described above. The divider plate 142 may include first and second fluid-injection openings 178, 180 in communication with a respective one of the first and second fluid-injection passageways 176, 177 and a respective compression chamber 158. A first valve member 182 may be disposed between the first fluid-injection passageway 176 and the first fluid-injection opening 178 and may be movable between a first position restricting or preventing fluid flow between the first fluid-injection passageway 176 and the first fluid-injection opening 178 and a second position allowing fluid flow between the first fluid-injection passageway 176 and the first fluid-injection opening 178. A second valve member 184 may be disposed between the second fluid-injection passageway 177 and the second fluid-injection opening 180 and may be movable between a first position restricting or preventing fluid flow between the second fluid-injection passageway 177 and the second fluid-injection opening 180 and a second position allowing fluid flow between the second fluid-injection passageway 177 and the second fluid-injection opening 180. As shown in FIG. 4, the valve members 182, 184 may engage valve seats 190, 192 formed on the cylinder housings 134, 136 when the valve members 182, 184 are in the first position. Springs 194 may bias the valve members 182, 184 toward the first position.

As shown in FIG. 4, the divider plate 142 may also include first and second recesses 143, 145 in fluid communication with respective first and second fluid-injection openings 178, 180 and respective third and fourth recesses 147, 149 formed in the cylinder housing 134, 136. The recesses 143, 145, 147, 149 may receive liquid that, due to the incompressibility of the liquid, may be forced out of the compression chambers 158. The recesses 143, 145, 147, 149 may act as a receptacle for the incompressible fluid and may reduce noise and/or damage associated with any unintended infiltration of liquid into the compression chambers 158.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

What is claimed is:

1. A compressor comprising:

a crankshaft including an eccentric portion;

a cylinder housing defining a cylindrical recess through which the crankshaft extends;

a rotor disposed within said cylindrical recess and engaging said eccentric portion of said crankshaft for movement with said crankshaft relative to said cylindrical recess, said rotor and a circumferential surface of said cylindrical recess defining a compression chamber therebetween;

a suction opening providing fluid at a first pressure to said cylindrical recess;

a discharge opening receiving compressed fluid from said compression chamber;

a fluid-injection passageway providing fluid at a second pressure to said compression chamber via a fluid-injection opening, said second pressure being higher than said first pressure;

a valve movable relative to said cylindrical recess between a first position allowing fluid flow from said fluid-injection passageway to said fluid-injection opening and a second position restricting fluid flow from said fluid-injection passageway to said fluid-injection opening; and a recess in fluid communication with said fluid-injection opening.

2. The compressor of claim 1, wherein said fluid-injection opening is formed in a plate disposed axially adjacent said cylinder housing and partially defining said compression chamber.

3. The compressor of claim 2, wherein said plate is disposed axially between said cylinder housing and another cylinder housing and partially defines another compression chamber.

4. The compressor of claim 3, wherein said recess is disposed in said plate, and wherein the compressor further comprises another recess disposed in said cylinder housing, said recesses are in fluid communication with each other.

5. The compressor of claim 1, wherein said recess is disposed radially outward relative to said fluid-injection opening.

6. The compressor of claim 5, wherein said valve is disposed radially between said recess and said fluid-injection opening.

7. The compressor of claim 1, wherein said recess is in fluid communication with said fluid-injection opening while said valve is in said second position.

8. The compressor of claim 1, wherein said valve is disposed radially between said fluid-injection opening and said recess.

9. The compressor of claim 1, wherein said fluid-injection opening and said discharge opening are at least partially aligned with each other in a direction parallel to a rotational axis of said crankshaft.

10. The compressor of claim 1, wherein said fluid-injection opening is at least partially axially aligned with said circumferential surface of said cylindrical recess.

11. A compressor comprising:

a crankshaft including first and second eccentric portions;

first and second cylinder housings defining first and second cylindrical recesses, respectively, through which the crankshaft extends;

a first rotor disposed within said first cylindrical recess and engaging said first eccentric portion of said crankshaft for movement with said crankshaft relative to said first cylindrical recess, said first rotor and a first circumferential surface of said first cylindrical recess defining a first compression chamber therebetween;

a second rotor disposed within said second cylindrical recess and engaging said second eccentric portion of said crankshaft for movement with said crankshaft relative to said second cylindrical recess, said second rotor and a second circumferential surface of said second cylindrical recess defining a second compression chamber therebetween;

a first fluid-injection passageway in communication with said first compression chamber via a first fluid-injection opening;

a second fluid-injection passageway in communication with said second compression chamber via a second fluid-injection opening;

a first valve moveable between a first position allowing fluid flow from said first fluid-injection passageway to said first fluid-injection opening and a second position restricting fluid flow from said first fluid-injection passageway to said first fluid-injection opening;

a second valve moveable between a first position allowing fluid flow from said second fluid-injection passageway to said second fluid-injection opening and a second position restricting fluid flow from said second fluid-injection passageway to said second fluid-injection opening; and first and second recesses in fluid communication with said first and second fluid-injection openings, respectively.

12. The compressor of claim 11, wherein said first recess is in fluid communication with said first fluid-injection opening while said first valve is in said second position, and wherein said second recess is in fluid communication with said second fluid-injection opening while said second valve is in said second position.

13. The compressor of claim 11, wherein said first and second recesses are disposed radially outward relative to said first and second fluid-injection openings.

14. The compressor of claim 13, wherein said first valve is disposed radially between said first fluid-injection opening and said first recess, and said second valve is disposed radially between said second fluid-injection opening and second first recess.

15. The compressor of claim 11, further comprising a divider plate disposed axially between said first and second cylinder housings, wherein said first and second fluid-injection openings and said first and second recesses are disposed within said divider plate.

16. The compressor of claim 15, further comprising third and fourth recesses in fluid communication with said first and second recesses, respectively, said third recess disposed in said first cylinder housing, said fourth recess disposed in said second cylinder housing.

17. The compressor of claim 15, wherein said first and second valves are spring-biased in opposite directions.

18. The compressor of claim 11, further comprising:

a suction opening providing fluid at a first pressure to said first cylindrical recess; and a discharge opening receiving compressed fluid from said first compression chamber, wherein said first and second fluid-injection openings provide fluid at a second pressure to said first and second compression chambers, respectively, said second pressure being higher than said first pressure.

19. The compressor of claim 18, wherein said first and second fluid-injection openings and said discharge opening are at least partially aligned with each other in a direction parallel to a rotational axis of said crankshaft such that said discharge opening and said first and second fluid-injection openings are at least partially disposed along a plane extending through said rotational axis.

20. The compressor of claim 18, wherein said first and second fluid-injection openings are at least partially axially aligned with said first and second circumferential surfaces.

* * * * *